United States Patent
Wang et al.

(10) Patent No.: US 10,325,649 B2
(45) Date of Patent: Jun. 18, 2019

(54) TERNARY SENSE AMPLIFIER AND SRAM ARRAY REALIZED BY THE TERNARY SENSE AMPLIFIER

(71) Applicant: Ningbo University, Zhejiang (CN)

(72) Inventors: Pengjun Wang, Zhejiang (CN); Daohui Gong, Zhejiang (CN); Yaopeng Kang, Zhejiang (CN); Huihong Zhang, Zhejiang (CN)

(73) Assignee: Ningbo University, Zhejiang (CN)

( * ) Notice: Subject to any disclaimer, the term of this patent is extended or adjusted under 35 U.S.C. 154(b) by 96 days.

(21) Appl. No.: 15/684,953

(22) Filed: Aug. 24, 2017

(65) Prior Publication Data

US 2018/0158515 A1 Jun. 7, 2018

(30) Foreign Application Priority Data

Dec. 7, 2016 (CN) .......................... 2016 1 1118462

(51) Int. Cl.
*G11C 11/419* (2006.01)
*G11C 11/412* (2006.01)
(Continued)

(52) U.S. Cl.
CPC ............ *G11C 11/419* (2013.01); *G11C 7/065* (2013.01); *G11C 11/412* (2013.01);
(Continued)

(58) Field of Classification Search
CPC ... G11C 11/419; G11C 11/412; H01L 27/283; H01L 51/0048; H01L 51/0558
See application file for complete search history.

(56) References Cited

U.S. PATENT DOCUMENTS 6,301,179 B1 * 10/2001 Lawson ................. G11C 7/067
365/203
8,503,221 B1 * 8/2013 Hobson ................. G11C 11/412
365/154
(Continued)

OTHER PUBLICATIONS

Lin et al., "Design of a Ternary Memory Cell Using CNTFETs," IEEE Transactions on Nanotechnology, Sep. 2012, pp. 1019-1025.
(Continued)

*Primary Examiner* — Sung Cho
(74) *Attorney, Agent, or Firm* — JCIPRNET (57) ABSTRACT

A ternary sense amplifier and an SRAM array realized by the ternary sense amplifier are provided. The ternary sense amplifier comprises the $1^{st}$ CNFET transistor, the $2^{nd}$ CNFET transistor, the $3^{rd}$ CNFET transistor, the $4^{th}$ CNFET transistor, the $5^{th}$ CNFET transistor, the $6^{th}$ CNFET transistor, the $7^{th}$ CNFET transistor, the $8^{th}$ CNFET transistor, the $9^{th}$ CNFET transistor, the $10^{th}$ CNFET transistor, the $11^{th}$ CNFET transistor, the $12^{th}$ CNFET transistor and the $13^{th}$ CNFET transistor; the SRAM array comprises a ternary sense amplifier, a ternary memory array, the $1^{st}$ inverter, the $2^{nd}$ inverter, the $3^{rd}$ inverter, the $4^{th}$ inverter, the $14^{th}$ CNFET transistor, the $15^{th}$ CNFET transistor, the $16^{th}$ CNFET transistor, the $17^{th}$ CNFET transistor, the $18^{th}$ CNFET transistor and the $19^{th}$ CNFET transistor; it features in low power consumption, less postponement and high yield of chips.

4 Claims, 6 Drawing Sheets

(51) Int. Cl.
*G11C 7/06* (2006.01)
*H01L 27/28* (2006.01)
*H01L 51/05* (2006.01)
*H01L 51/00* (2006.01)

(52) U.S. Cl.
CPC ........ *H01L 27/283* (2013.01); *H01L 51/0048* (2013.01); *H01L 51/0558* (2013.01)

(56) References Cited

U.S. PATENT DOCUMENTS

| | | | |
|---|---|---|---|
| 9,318,189 B2* | 4/2016 | Nakazato | G11C 11/419 |
| 2007/0097765 A1* | 5/2007 | Huang | G11C 7/062 |
| | | | 365/205 |
| 2013/0148453 A1* | 6/2013 | John | G11C 7/065 |
| | | | 365/210.1 |
| 2016/0203856 A1* | 7/2016 | Sachdev | G11C 11/419 |
| | | | 365/154 |

OTHER PUBLICATIONS

Wang et al., "Design of high-speed high-reliability voltage mode sense amplifier," Computer Technology and Its Applications, May 2010, pp. 143-147.

Wicht et al, "Yield and Speed Optimization of a Latch-Type Voltage Sense Amplifier," IEEE Journal of Solid-State Circuits, Jul. 2004, pp. 1148-1158.

Arslan et al, "Variation-Tolerant SRAM Sense-Amplifier Timing Using Configurable Replica Bitlines," IEEE 2008 Custom Intergrated Circuits Conference, Sep. 2008 , pp. 415-418.

Tao et al., "Design of Sense Amplifier in the High Speed SRAM," 2015 International Conference on Cyber-Enabled Distributed Computing and Knowledge Discovery, Sep. 2015, pp. 384-387.

Chandankhede et al., "Design of High Speed Sense Amplifier for SRAM," IEEE International Conference on Advanced Communication Control and Computing Technologies, May 2014, pp. 340-343.

* cited by examiner

TERNARY SENSE AMPLIFIER AND SRAM ARRAY REALIZED BY THE TERNARY SENSE AMPLIFIER

CROSS-REFERENCE TO RELATED APPLICATION

This application claims the priority benefit of China application serial no. 201611118462.9, filed on Dec. 7, 2016. The entirety of the above-mentioned patent application is hereby incorporated by reference herein and made a part of this specification.

FIELD OF THE INVENTION

The present invention is related to a sense amplifier, in particular to a ternary sense amplifier and SRAM array realized by the Ternary Sense Amplifier.

DESCRIPTION OF RELATED ART

Accompanied by development of integrated circuit, over 50% transistors in the microprocessor have been applied to memory design. As memory design has high impact on the performance of microprocessor, it is of vital importance to design a high-performance memory. It is applicable to improve the performance of memory through improvement of its peripheral circuit. Sense amplifier is one of important peripheral circuits of the memory, of which performance has direct impact on the speed and power consumption of the memory. Literature: "Lin S, Kim Y B, Lombardi F. Design of a Ternary Memory Cell Using CNTFETs [J]. IEEE Transactions on Nanotechnology, 2012, 11(5): 1019-1025." has proposed a design scheme for the ternary SRAM unit (ternary Static Random Access Memory); as ternary SRAM array features in high density of stored information, there are more and more studies focusing on the ternary memory both at home and abroad. As ternary SRAM circuit has such disadvantages as higher bit-line capacitance and long charge and discharge time, ternary SRAM signal reading speed is restricted. The ternary sense amplifier can amplify bit-line less-amplitude differential signal, and output full-amplitude signal to improve the reading speed and output signal driving capability of the ternary memory.

As the process dimension is accurate to nanometer scale, threshold voltage mismatch to MOS transistor has become more serious, and offset voltage of the ternary sense amplifier designed based on CMOS technology has become much higher to the extent of resulting in low yield of chips. High leakage current and inter-electrode capacitance of MOS transistor is determined by its physical properties, which may result in high power consumption and postponement to the ternary sense amplifier as designed. Transport of current carrier of the Carbon Nanotube (CNT) in quasi one-dimension structure is provided with ballistic transmission property; CNT features in high electronic control capability as compared with 3D silicon and silicon on the 2D insulating substrate. Carbon Nanotube Field Effect Transistor (CNFET) is formed by taking CNT as the conducting channel, which features in less CNFET threshold voltage mismatch; the ternary sense amplifier designed on the basis of CNFET is characterized by low offset voltage and high yield of chips.

On this account, it is of vital importance to design a ternary sense amplifier and SRAM array as realized by it featuring in low power consumption, less postponement and high yield of chips based on CNFET technology and ternary logic theory.

SUMMARY OF THE INVENTION

One technical issue to be settled by the present invention is to provide a ternary sense amplifier featuring in low power consumption, less postponement and high yield of chips.

Technical solution used by the present invention to solve aforesaid technical issue is stated as follows: A ternary sense amplifier, comprising the $1^{st}$ CNFET transistor, the $2^{nd}$ CNFET transistor, the $3^{rd}$ CNFET transistor, the $4^{th}$ CNFET transistor, the $5^{th}$ CNFET transistor, the $6^{th}$ CNFET transistor, the $7^{th}$ CNFET transistor, the $8^{th}$ CNFET transistor, the $9^{th}$ CNFET transistor, the $10^{th}$ CNFET transistor, the $11^{th}$ CNFET transistor, the $12^{th}$ CNFET transistor and the $13^{th}$ CNFET transistor; the $1^{st}$ CNFET transistor, the $2^{nd}$ CNFET transistor, the $3^{rd}$ CNFET transistor, the $6^{th}$ CNFET transistor, the $11^{th}$ CNFET transistor, the $12^{th}$ CNFET transistor and the $13^{th}$ CNFET transistor belong to P CNFET transistors; the $4^{th}$ CNFET transistor, the $5^{th}$ CNFET transistor, the $7^{th}$ CNFET transistor, the $8^{th}$ CNFET transistor, the $9^{th}$ CNFET transistor and the $10^{th}$ CNFET transistor belong to N CNFET transistors; source of the $1^{st}$ CNFET transistor, source of the $2^{nd}$ CNFET transistor, source of the $3^{rd}$ CNFET transistor, gate of the $5^{th}$ CNFET transistor and source of the $6^{th}$ CNFET transistor are connected to gate of the $8^{th}$ CNFET transistor, and the connecting terminal is connected to the $1^{st}$ power source; gate of the $1^{st}$ CNFET transistor and gate of the $2^{nd}$ CNFET transistor are connected to gate of the $13^{th}$ CNFET transistor, and the connecting terminal is enabling signal input terminal of the said ternary sense amplifier; drain of the $1^{st}$ CNFET transistor, gate of the $3^{rd}$ CNFET transistor, gate of the $4^{th}$ CNFET transistor, drain of the $6^{th}$ CNFET transistor, drain of the $7^{th}$ CNFET transistor and source of the $8^{th}$ CNFET transistor are connected to drain of the $13^{th}$ CNFET transistor, and the connecting terminal is output terminal of the said ternary sense amplifier; drain of the $2^{nd}$ CNFET transistor, drain of the $3^{rd}$ CNFET transistor, drain of the $4^{th}$ CNFET transistor, source of the $5^{th}$ CNFET transistor, gate of the $6^{th}$ CNFET transistor and gate of the $7^{th}$ CNFET transistor are connected to source of the $13^{th}$ CNFET transistor, and the connecting terminal is inverting output terminal of the said ternary sense amplifier; source of the $4^{th}$ CNFET transistor is connected to drain of the $9^{th}$ CNFET transistor; drain of the $5^{th}$ CNFET transistor is connected to drain of the $8^{th}$ CNFET transistor, and the connecting terminal is connected to the $2^{nd}$ power source; the $2^{nd}$ power source is equivalent to half of the $1^{st}$ power source; source of the $7^{th}$ CNFET transistor is connected to drain of the $10^{th}$ CNFET transistor; source of the $9^{th}$ CNFET transistor, source of the $10^{th}$ CNFET transistor and gate of the $11^{th}$ CNFET transistor are connected to gate of the $12^{th}$ CNFET transistor, and the connecting terminal is inverting enabling signal input terminal of the said ternary sense amplifier; gate of the $9^{th}$ CNFET transistor is connected to drain of the $11^{th}$ CNFET transistor; source of the $11^{th}$ CNFET transistor is input terminal of the said ternary sense amplifier; gate of the $10^{th}$ CNFET transistor is connected to drain of the $12^{th}$ CNFET transistor; source of the $12^{th}$ CNFET transistor is inverting input terminal of the said ternary sense amplifier.

As compared with prior arts, advantage of the ternary sense amplifier according to present invention lies in the fact that it is composed of the $1^{st}$ CNFET transistor, the $2^{nd}$ CNFET transistor, the $3^{rd}$ CNFET transistor, the $4^{th}$ CNFET transistor, the 5$^{th}$ CNFET transistor, the 6$^{th}$ CNFET transistor, the 7$^{th}$ CNFET transistor, the 8$^{th}$ CNFET transistor, the 9$^{th}$ CNFET transistor, the 10$^{th}$ CNFET transistor, the 11$^{th}$ CNFET transistor, the 12$^{th}$ CNFET transistor and the 13$^{th}$ CNFET transistor based on study of principles on the Carbon Nanotube Field Effect Transistor and sense amplifier; the 1$^{st}$ CNFET transistor and the 2$^{nd}$ CNFET transistor belong to pre-charge transistors; the 3$^{rd}$ CNFET transistor, the 4$^{th}$ CNFET transistor, the 5$^{th}$ CNFET transistor, the 6$^{th}$ CNFET transistor, the 7$^{th}$ CNFET transistor and the 8$^{th}$ CNFET transistor form a cross-coupling positive feedback latch structure; the 9$^{th}$ CNFET transistor and the 10$^{th}$ CNFET transistor belong to differential input transistors; the 11$^{th}$ CNFET transistor and the 12$^{th}$ CNFET transistor belong to transmission transistor used to accelerate speed of differential signals; the enabling signal is used to control the circuit status, and reduce the power consumption of the ternary sense amplifier; the 32 nm standard CNFET model base is used for HSPICE simulation; as indicated by results, the circuit according to the present invention has correct logic function with yield of chips up to 96.48%; it is provided with higher stability, which can improve the working speed by 64%, and reduce the power consumption by 83.4% as compared with the two-value sense amplifier designed on the basis of CMOS.

The second technical issue to be settled by the present invention is to provide an SRAM array realized by the ternary sense amplifier featuring in low power consumption, less postponement and high yield of chips.

Technical solution used by the present invention to settle the second technical issue is stated as follows: An SRAM array realized by the ternary sense amplifier, comprising a ternary sense amplifier, a ternary memory array, the 1$^{st}$ inverter, the 2$^{nd}$ inverter, the 3$^{rd}$ inverter, the 4$^{th}$ inverter, the 14$^{th}$ CNFET transistor, the 15$^{th}$ CNFET transistor, the 16$^{th}$ CNFET transistor, the 17$^{th}$ CNFET transistor, the 18$^{th}$ CNFET transistor and the 19$^{th}$ CNFET transistor; the said ternary memory array is provided a bit line and an inverting bit line; the 14$^{th}$ CNFET transistor, the 15$^{th}$ CNFET transistor, the 16$^{th}$ CNFET transistor and the 18$^{th}$ CNFET transistor belong to P CNFET transistors; the 17$^{th}$ CNFET transistor and the 19$^{th}$ CNFET transistor belong to N CNFET transistors; the said ternary sense amplifier comprises the 1$^{st}$ CNFET transistor, the 2$^{nd}$ CNFET transistor, the 3$^{rd}$ CNFET transistor, the 4$^{th}$ CNFET transistor, the 5$^{th}$ CNFET transistor, the 6$^{th}$ CNFET transistor, the 7$^{th}$ CNFET transistor, the 8$^{th}$ CNFET transistor, the 9$^{th}$ CNFET transistor, the 10$^{th}$ CNFET transistor, the 11$^{th}$ CNFET transistor, the 12$^{th}$ CNFET transistor and the 13$^{th}$ CNFET transistor; the 1$^{st}$ CNFET transistor, the 2$^{nd}$ CNFET transistor, the 3$^{rd}$ CNFET transistor, the 6$^{th}$ CNFET transistor, the 11$^{th}$ CNFET transistor, the 12$^{th}$ CNFET transistor and the 13$^{th}$ CNFET transistor belong to P CNFET transistors; the 4$^{th}$ CNFET transistor, the 5$^{th}$ CNFET transistor, the 7$^{th}$ CNFET transistor, the 8$^{th}$ CNFET transistor, the 9$^{th}$ CNFET transistor and the 10$^{th}$ CNFET transistor belong to N CNFET transistors; source of the 1$^{st}$ CNFET transistor, source of the 2$^{nd}$ CNFET transistor, source of the 3$^{rd}$ CNFET transistor, gate of the 5$^{th}$ CNFET transistor and source of the 6$^{th}$ CNFET transistor are connected to gate of the 8$^{th}$ CNFET transistor, and the connecting terminal is connected to the 1$^{st}$ power source; gate of the 1$^{st}$ CNFET transistor and gate of the 2$^{nd}$ CNFET transistor are connected to gate of the 13$^{th}$ CNFET transistor, and the connecting terminal is enabling signal input terminal of the said ternary sense amplifier; drain of the 1$^{st}$ CNFET transistor, gate of the 3$^{rd}$ CNFET transistor, gate of the 4$^{th}$ CNFET transistor, drain of the 6$^{th}$ CNFET transistor, drain of the 7$^{th}$ CNFET transistor and source of the 8$^{th}$ CNFET transistor are connected to drain of the 13$^{th}$ CNFET transistor, and the connecting terminal is output terminal of the said ternary sense amplifier; drain of the 2$^{nd}$ CNFET transistor, drain of the 3$^{rd}$ CNFET transistor, drain of the 4$^{th}$ CNFET transistor, source of the 5$^{th}$ CNFET transistor, gate of the 6$^{th}$ CNFET transistor and gate of the 7$^{th}$ CNFET transistor are connected to source of the 13$^{th}$ CNFET transistor, and the connecting terminal is inverting output terminal of the said ternary sense amplifier; source of the 4$^{th}$ CNFET transistor is connected to drain of the 9$^{th}$ CNFET transistor; drain of the 5$^{th}$ CNFET transistor is connected to drain of the 8$^{th}$ CNFET transistor, and the connecting terminal is connected to the 2$^{nd}$ power source; the 2$^{nd}$ power source is equivalent to half of the 1$^{st}$ power source; source of the 7$^{th}$ CNFET transistor is connected to drain of the 10$^{th}$ CNFET transistor; source of the 9$^{th}$ CNFET transistor, source of the 10$^{th}$ CNFET transistor and gate of the 11$^{th}$ CNFET transistor are connected to gate of the 12$^{th}$ CNFET transistor, and the connecting terminal is inverting enabling signal input terminal of the said ternary sense amplifier; gate of the 9$^{th}$ CNFET transistor is connected to drain of the 11$^{th}$ CNFET transistor; source of the 11$^{th}$ CNFET transistor is input terminal of the said ternary sense amplifier; gate of the 10$^{th}$ CNFET transistor is connected to drain of the 12$^{th}$ CNFET transistor; source of the 12$^{th}$ CNFET transistor is inverting input terminal of the said ternary sense amplifier; source of the 14$^{th}$ CNFET transistor and source of the 15$^{th}$ CNFET transistor are connected to the 2$^{nd}$ power source; gate of the 14$^{th}$ CNFET transistor is connected to gate of the 15$^{th}$ CNFET transistor, and the connecting terminal is pre-charge signal input terminal of the SRAM array realized by the said ternary sense amplifier; drain of the 14$^{th}$ CNFET transistor, source of the 16$^{th}$ CNFET transistor and drain of the 17$^{th}$ CNFET transistor are connected to the bit line of the said memory array respectively; drain of the 15$^{th}$ CNFET transistor, source of the 18$^{th}$ CNFET transistor and drain of the 19$^{th}$ CNFET transistor are connected to inverting bit line of the said memory array respectively; gate of the 17$^{th}$ CNFET transistor is connected to gate of the 19$^{th}$ CNFET transistor, and the connecting terminal is column selection signal input terminal of the SRAM array realized by the said ternary sense amplifier; gate of the 16$^{th}$ CNFET transistor is connected to gate of the 18$^{th}$ CNFET transistor, and the connecting terminal is inverting column selection signal input terminal of the SRAM array realized by the said ternary sense amplifier; drain of the 16$^{th}$ CNFET transistor and source of the 17$^{th}$ CNFET transistor are connected to input terminal of the said ternary sense amplifier; drain of the 18$^{th}$ CNFET transistor and source of the 19$^{th}$ CNFET transistor are connected to inverting input terminal of the said ternary sense amplifier; output terminal of the said ternary sense amplifier is connected to input terminal of the 1$^{st}$ inverter; output terminal of the 1$^{st}$ inverter is connected to input terminal of the 3$^{rd}$ inverter; output terminal of the 3$^{rd}$ inverter is output terminal of the SRAM array realized by the said ternary sense amplifier; inverting output terminal of the said ternary sense amplifier is connected to input terminal of the 2$^{nd}$ inverter; output terminal of the 2$^{nd}$ inverter is connected to input terminal of the 4$^{th}$ inverter; output terminal of the 4$^{th}$ inverter is output terminal of the SRAM array realized by the said ternary sense amplifier.

The said ternary memory array comprises numerous ternary memory cells; the said ternary memory cell comprises the 20$^{th}$ CNFET transistor, the 21$^{st}$ CNFET transistor, the 5$^{th}$ inverter and the 6$^{th}$ inverter; the 20$^{th}$ CNFET transistor and the 21$^{st}$ CNFET transistor belong to N CNFET transistors;

gate of the 20th CNFET transistor is connected to gate of the 21st CNFET transistor, and the connecting terminal is bit-line control signal input terminal of the said ternary memory cell; drain of the 20th CNFET transistor and input terminal of the 5th inverter are connected to output terminal of the 6th inverter; drain of the 21st CNFET transistor and output terminal of the 5th inverter are connected to input terminal of the 6th inverter; source of the 20th CNFET transistor is bit-line terminal of the said ternary memory cell; source of the 21st CNFET transistor is inverting bit-line terminal of the said ternary memory cell; numerous bit-line terminals of the said ternary memory cell are connected, and the connecting line is bit line of the SRAM array realized by the said ternary sense amplifier; numerous inverting bit-line terminals of the said ternary memory cell are connected, and the connecting line is inverting bit line of the SRAM array realized by the said ternary sense amplifier. In this circuit, the ternary memory cell is designed based on CNFET transistor, which features in less read-write postponement and improved working speed; meanwhile, it also features in higher density of stored information and lower power consumption.

The 1st inverter comprises the 22nd CNFET transistor, the 23rd CNFET transistor and the 24th CNFET transistor; the 22nd CNFET transistor belongs to P CNFET transistor; the 23rd CNFET transistor and the 24th CNFET transistor belong to N CNFET transistors; source of the 22nd CNFET transistor and gate of the 24th CNFET transistor are connected to the 1st power source; gate of the 22nd CNFET transistor is connected to gate of the 23rd CNFET transistor, and the connecting terminal is input terminal of the 1st inverter; drain of the 22nd CNFET transistor and drain of the 23rd CNFET transistor are connected to source of the 24th CNFET transistor, and the connecting terminal is output terminal of the 1st inverter; source of the 23rd CNFET transistor is grounded; drain of the 24th CNFET transistor is connected to the 2nd power source; structure of the 2nd inverter, the 3rd inverter, the 46th inverter, the 5th inverter and the 6th inverter is identical to that of the 1st inverter. In this circuit, the 1st inverter belongs to ternary inverter designed based on CNFET; as the CNFET transistor features in easy regulation of the circuit by the threshold voltage, the 1st inverter has higher stability which can maintain the memory logic value at "0", "1" and "2" to ensure low power consumption and high speed.

As compared with prior arts, advantage of the ternary sense amplifier according to present invention lies in the fact that it aims to constitute the SRAM array realized by ternary sense amplifier through the ternary sense amplifier, ternary memory array, the 1st inverter, the 2nd inverter, the 3rd inverter, the 4th inverter, the 14th CNFET transistor, the 15th CNFET transistor, the 16th CNFET transistor, the 17th CNFET transistor, the 18th CNFET transistor and the 19th CNFET transistor; it makes use of the 1st CNFET transistor, the 2nd CNFET transistor, the 3rd CNFET transistor, the 4th CNFET transistor, the 5th CNFET transistor, the 6th CNFET transistor, the 7th CNFET transistor, the 8th CNFET transistor, the 9th CNFET transistor, the 10th CNFET transistor, the 11th CNFET transistor, the 12th CNFET transistor and the 13th CNFET transistor to constitute the ternary sense amplifier based on study of principles on the Carbon Nanotube Field Effect Transistor and sense amplifier; the 1st CNFET transistor and the 2nd CNFET transistor belong to pre-charge transistors; the 3rd CNFET transistor, the 4th CNFET transistor, the 5th CNFET transistor, the 6th CNFET transistor, the 7th CNFET transistor and the 8th CNFET transistor form a cross-coupling positive feedback latch structure; the 9th CNFET transistor and the 10th CNFET transistor belong to differential input transistors; the 11th CNFET transistor and the 12th CNFET transistor belong to transmission transistor used to accelerate speed of differential signals; the enabling signal is used to control the circuit status, and reduce the power consumption of the ternary sense amplifier; the 32 nm standard CNFET model base is used for HSPICE simulation; as indicated by results, the circuit according to the present invention has correct logic function with yield of chips up to 96.48%; it is provided with higher stability, which can improve the working speed by 64%, and reduce the power consumption by 83.4% as compared with the two-value sense amplifier designed on the basis of CMOS; on this account, the SRAM array realized by the ternary sense amplifier according to the present invention features in low power consumption, less postponement and high yield of chips.

DETAILED DESCRIPTION OF THE INVENTION

The present invention discloses a ternary sense amplifier; the ternary sense amplifier according to the present invention is further described as follows in combination with embodiments for drawings.

Embodiment

Figure 1:
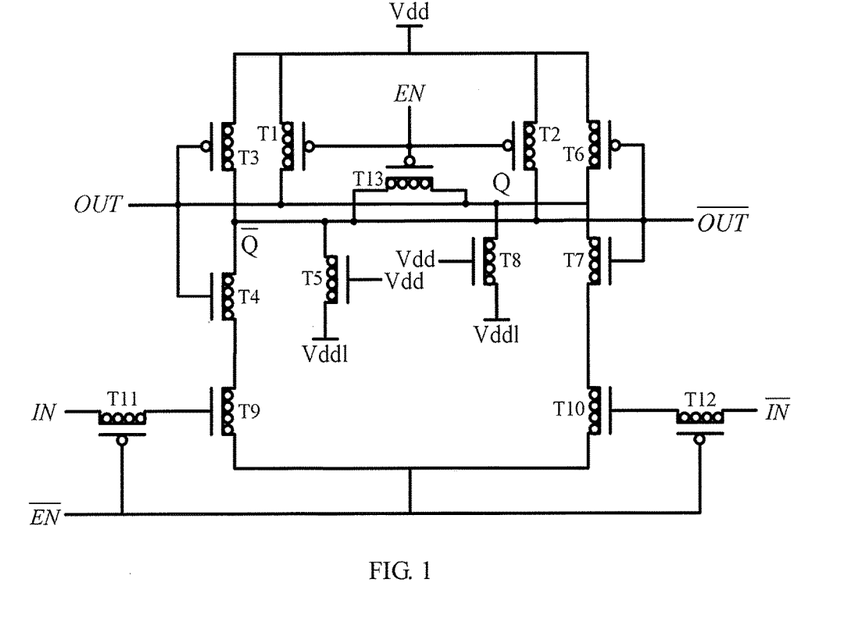
FIG. 1 is the circuit diagram for the ternary sense amplifier according to the present invention.

A ternary sense amplifier as shown in FIG. 1, comprising the 1st CNFET transistor T1, the 2nd CNFET transistor T2, the 3rd CNFET transistor T3, the 4th CNFET transistor T4, the 5th CNFET transistor T5, the 6th CNFET transistor T6, the 7th CNFET transistor T7, the 8th CNFET transistor T8, the 9th CNFET transistor T9, the 10th CNFET transistor T10, the 11th CNFET transistor T11, the 12th CNFET transistor T12 and the 13th CNFET transistor T13; the 1st CNFET transistor T1, the 2nd CNFET transistor T2, the 3rd CNFET transistor T3, the 6th CNFET transistor T6, the 11th CNFET transistor T11, the 12th CNFET transistor T12 and the 13th CNFET transistor T13 belong to P CNFET transistors; the 4th CNFET transistor T4, the 5th CNFET transistor T5, the 7th CNFET transistor T7, the 8th CNFET transistor T8, the 9th CNFET transistor T9 and the 10th CNFET transistor T10 belong to N CNFET transistors; source of the 1st CNFET transistor T1, source of the 2nd CNFET transistor T2, source of the 3rd CNFET transistor T3, gate of the 5th CNFET transistor T5 and source of the 6$^{th}$ CNFET transistor T6 are connected to gate of the 8$^{th}$ CNFET transistor T8, and the connecting terminal is connected to the 1$^{st}$ power source Vdd; gate of the 1$^{st}$ CNFET transistor T1 and gate of the 2$^{nd}$ CNFET transistor T2 are connected to gate of the 13$^{th}$ CNFET transistor T13, and the connecting terminal is enabling signal input terminal of the said ternary sense amplifier; drain of the 1$^{st}$ CNFET transistor T1, gate of the 3$^{rd}$ CNFET transistor T3, gate of the 4$^{th}$ CNFET transistor T4, drain of the 6$^{th}$ CNFET transistor T6, drain of the 7$^{th}$ CNFET transistor T7 and source of the 8$^{th}$ CNFET transistor T8 are connected to drain of the 13$^{th}$ CNFET transistor T13, and the connecting terminal is output terminal of the said ternary sense amplifier; drain of the 2$^{nd}$ CNFET transistor T2, drain of the 3rd CNFET transistor T3, drain of the 4$^{th}$ CNFET transistor T4, source of the 5$^{th}$ CNFET transistor T5, gate of the 6$^{th}$ CNFET transistor T6 and gate of the 7$^{th}$ CNFET transistor T7 are connected to source of the 13$^{th}$ CNFET transistor T13, and the connecting terminal is inverting output terminal of the said ternary sense amplifier; source of the 4$^{th}$ CNFET transistor T4 is connected to drain of the 9$^{th}$ CNFET transistor T9; drain of the 5$^{th}$ CNFET transistor T5 is connected to drain of the 8$^{th}$ CNFET transistor T8, and the connecting terminal is connected to the 2$^{nd}$ power source Vdd1; the 2$^{nd}$ power source T2 is equivalent to half of the 1$^{st}$ power source Vdd; source of the 7$^{th}$ CNFET transistor T7 is connected to drain of the 10$^{th}$ CNFET transistor T10; source of the 9$^{th}$ CNFET transistor T9, source of the 10$^{th}$ CNFET transistor T10 and gate of the 11$^{th}$ CNFET transistor T11 are connected to gate of the 12$^{th}$ CNFET transistor T12, and the connecting terminal is inverting enabling signal input terminal of the said ternary sense amplifier; gate of the 9$^{th}$ CNFET transistor T9 is connected to drain of the 11$^{th}$ CNFET transistor T11; source of the 11$^{th}$ CNFET transistor T11 is input terminal of the said ternary sense amplifier; gate of the 10$^{th}$ CNFET transistor T10 is connected to drain of the 12$^{th}$ CNFET transistor T12; source of the 12$^{th}$ CNFET transistor T12 is inverting input terminal of the said ternary sense amplifier.

HSPICE is used for simulation of the ternary sense amplifier of the present invention based on 32CNFET standard model base of Stanford University so as to evaluate the performance of the ternary sense amplifier of the present invention on such aspects as yield of chips, speed and power consumption. Major parameters for the standard model base are stated as follows: Supply voltage is Vdd=0.9 V and Vdd1=0.45 V respectively; length of physical channel of CNFET transistor is Lch=32 nm; doping length of Carbon Nanotube scattering to the S/D region is Lss=32 nm and Ldd=32 nm respectively; free path length of ballistic scattering in the intrinsic Carbon Nanotube area is Lgeff=100 nm; capacitance between the channel and substrate is Csub=20 pF/m.

Figure 2:
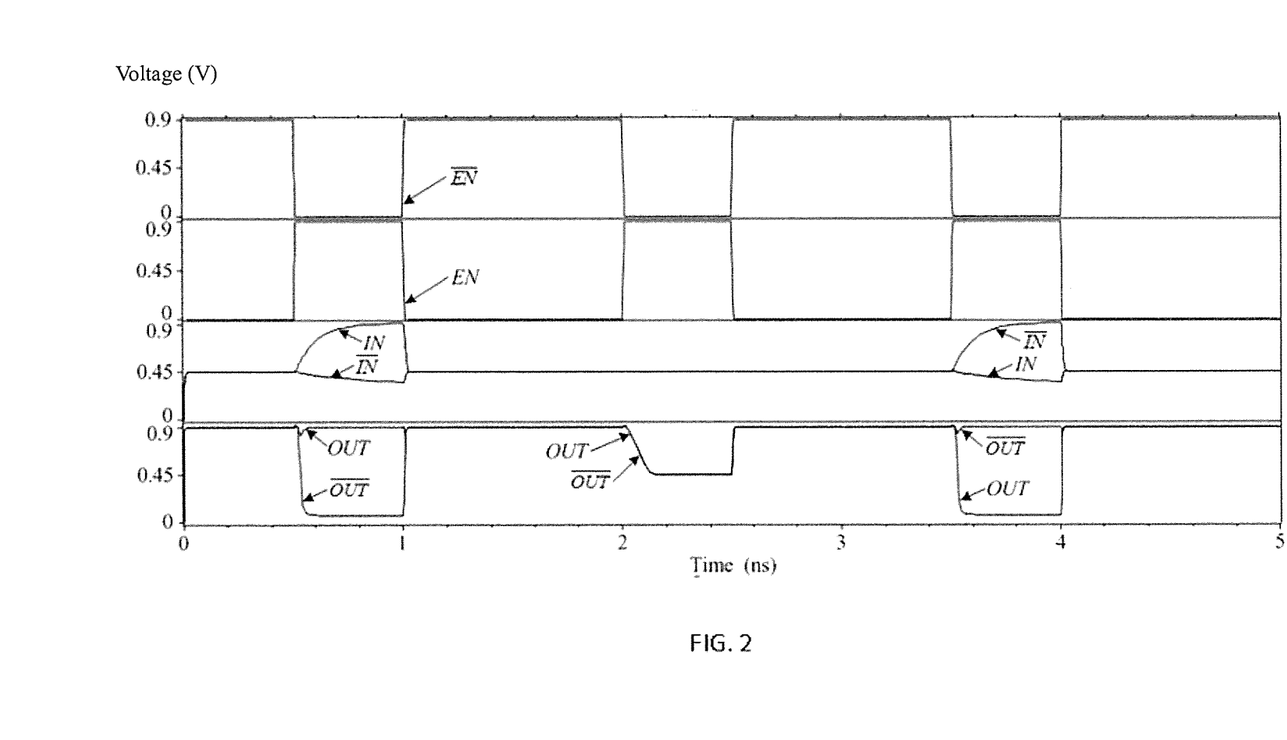
FIG. 2 is the working waveform for the ternary sense amplifier according to the present invention.

Working waveform of the three-value sense amplifier according to the present invention is as shown in FIG. 2. According to analysis of FIG. 2, the ternary sense amplifier is to be at pre-charge stage when the enabling signal EN input from the ternary sense amplifier is at low level, and inverting enabling signal $\overline{EN}$ is at high level; output voltage from its output terminal OUT and inverting output terminal $\overline{OUT}$ will be at high level (equal to the 1$^{st}$ power source Vdd); the ternary sense amplifier is to be at working stage when EN is at high level, and $\overline{EN}$ is at low level; output voltage from its output terminal OUT and inverting output terminal $\overline{OUT}$ will be determined by the input signal and inverting input signal input into the ternary sense amplifier. When input signal exceeds inverting input signal, high level is to be output from the output terminal, and low level is to be output from the inverting output terminal; when input signal is below inverting signal, low level is to be output from the output terminal, and high level is to be output from the inverting output terminal; when input signal is equal to inverting signal, intermediate level (2$^{nd}$ power source Vdd) is to be output from the output terminal and inverting output terminal respectively; the ternary sense amplifier of the present invention is fully correct in logic function.

In the ternary sense amplifier according to the present invention, inter-electrode capacitance of CNFET transistor is far below the inter-electrode capacitance of MOSFET; therefore, working speed of the ternary sense amplifier according to the present invention can be improved. Postponement of the three-value sense amplifier according to the present invention is compared with that of existing ternary sense amplifier, and the data is as shown in Table 1.

TABLE 1

| Postponement Data | | |
| --- | --- | --- |
| Literature | Process | Postponement/ps |
| 1 | 150 nm CMOS | 84 |
| 2 | 130 nm CMOS | 75 |
| 3 | 90 nm CMOS | 90 |
| The present invention | 32 nm CNFET | 27 |

In Table 1, Literature 1 refers to the sense amplifier disclosed in "Yi Ran, Yu Zongguang, Jia Ze. Design of High-Speed High-Reliability Voltage Mode Sense Amplifier [J]. Application of Electronic Technique, 2010, 36(5): 143-147."; Literature 2 refers to the sense amplifier disclosed in "B, Nirschl T, Schmitt-Landsiedel D. Yield and Speed Optimization of a Latch-Type Voltage Sense Amplifier[J]. IEEE Journal of Solid-State Circuits, 2004, 39(7): 1148-1158."; Literature 3 refers to the sense amplifier disclosed in "n U, Mccartney M P, Bhargava M, et al. Variation-Tolerant SRAM Sense-Amplifier Timing Using Configurable Replica Bitlines[C]// IEEE Custom Integrated Circuits Conference. 2008: 415-418."; viewing from Table 1, it can be seen that working speed of the ternary sense amplifier according to the present invention can be increased by 64% at least as compared with prior arts.

Figure 3:
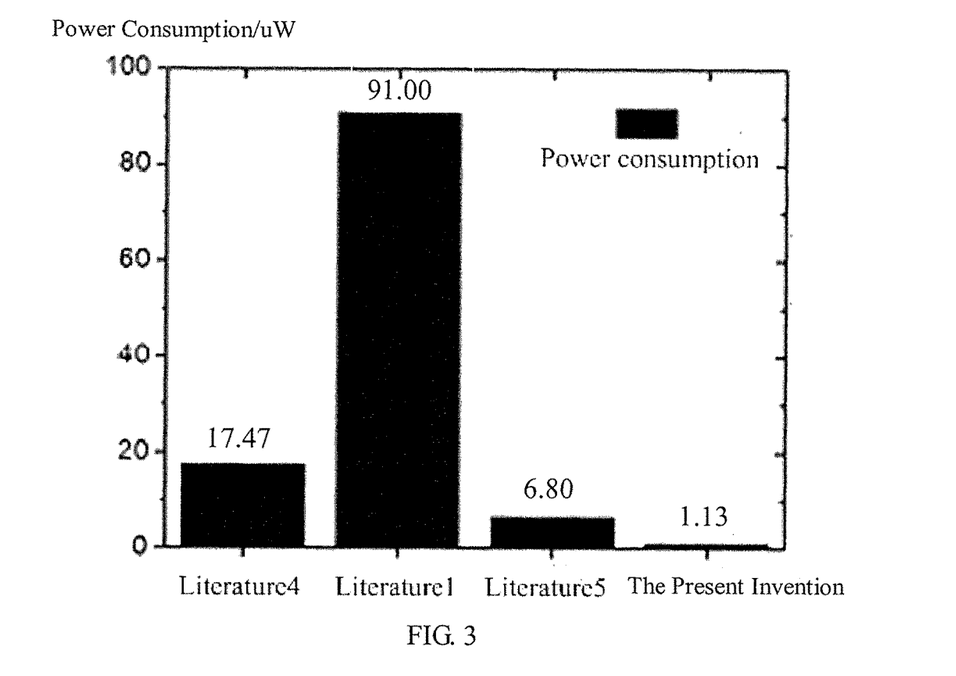
FIG. 3 is the diagram for comparison of power consumption of the sense amplifier according to the present invention and that according to prior arts.

A comparison of power consumption to the sense amplifier according to the present invention and the sense amplifier according to prior arts is as shown in FIG. 3; in FIG. 3, Literature 4 refers to the sense amplifier disclosed in "ao Y P, Hu W P. Design of Sense Amplifier in the High Speed SRAM[C]// IEEE International Conference on Cyber-Enabled Distributed Computing and Knowledge Discovery. 2015: 384-387."; Literature 5 refers to the sense amplifier disclosed in "handankhede R D, Acharya D P, Patra P K. Design of High Speed Sense Amplifier for SRAM[C]// IEEE International Conference on Advanced Communication Control and Computing Technologies. 2014: 340-343.". According to analysis of FIG. 3, power consumption of the ternary sense amplifier according to the present invention can be reduced by 83.4% at least as compared with existing sense amplifier.

Yield of chips for the sense amplifier refers to the proportion of chips that can output correct logic value among a large number of chips under certain differential input voltage. Parameters for each CNFET transistor are unlikely to be fully identical due to process variations; therefore, rate of finished chips for the sense amplifier is affected by process variations. It is of vital importance to improve the yield of chips for the sense amplifier in order to read data in the memory correctly; yield of the sense amplifier is measured through Monte Carlo Simulation for 10000 times. Data on comparison of yield for the ternary sense amplifier according to the present invention and existing sense amplifier is as shown in Table 2.

TABLE 2

A Comparison of Yield of Chips for Sense Amplifier

| Literature | Process | Yield of Chips |
| --- | --- | --- |
| 1 | 150 nm CMOS | 63.51% |
| 2 | 130 nm CMOS | 84.13% |
| 3 | 90 nm CMOS | 83.00% |
| The present invention | 32 nm CNFET | 96.48% |

According to analysis of Table 2, yield of the ternary sense amplifier according to the present invention has witnessed a significant increase to 96.48% as compared with the two-value sense amplifier based on CMOS process.

Figure 4:
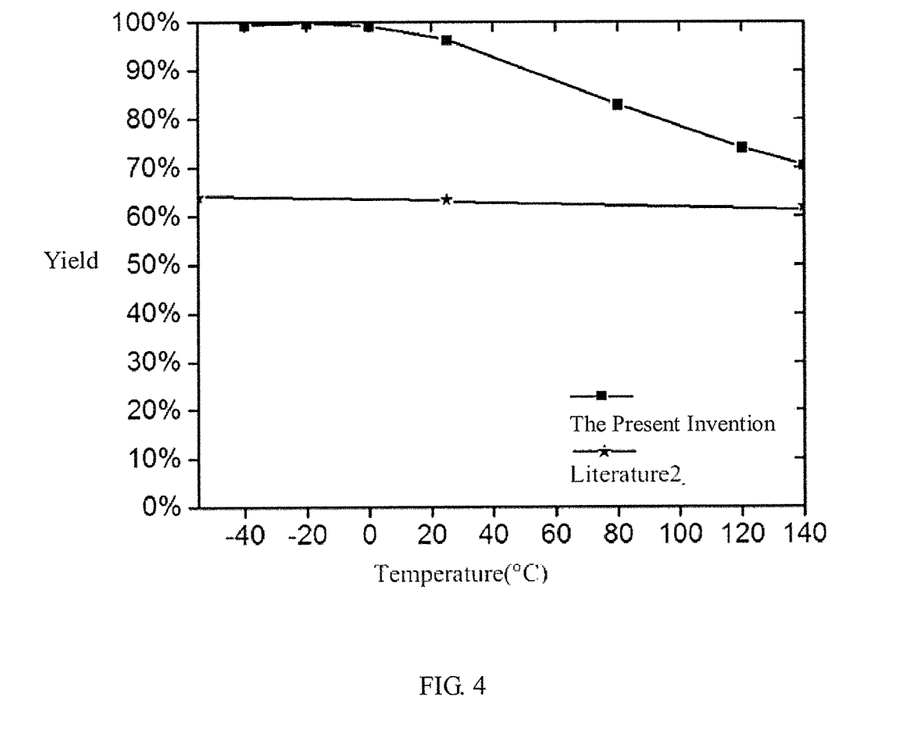
FIG. 4 shows yield of chips for the sense amplifier according to the present invention and that according to prior arts under different temperature.

Yield of chips might be affected under different temperature conditions, which can reflect the stability of the sense amplifier. To verify stability of the ternary sense amplifier according to the present invention, yield of chips is measured through Monte Carlo simulation for 10000 times under different temperature conditions (−55° C.~140° C.) and under the given differential input voltage of 100 mV. Yield of chips for the sense amplifier according to the present invention and the sense amplifier according to prior arts is as shown in FIG. 4. According to analysis of FIG. 4, yield of chips is to be up to 90% when the temperature is below 50° C.; yield of chips may witness a slight decrease when temperature is above 50° C.; however, it is still above 71%; on the contrary, yield in Literature 2 is so limited in variation and relatively low; the ternary sense amplifier according to the present invention is provided with higher stability.

The present invention discloses an SRAM array realized by aforesaid ternary sense amplifier; the SRAM array realized by the ternary sense amplifier according to the present invention is further described as follows in combination with embodiments for drawings.

Embodiment 1

Figure 5:
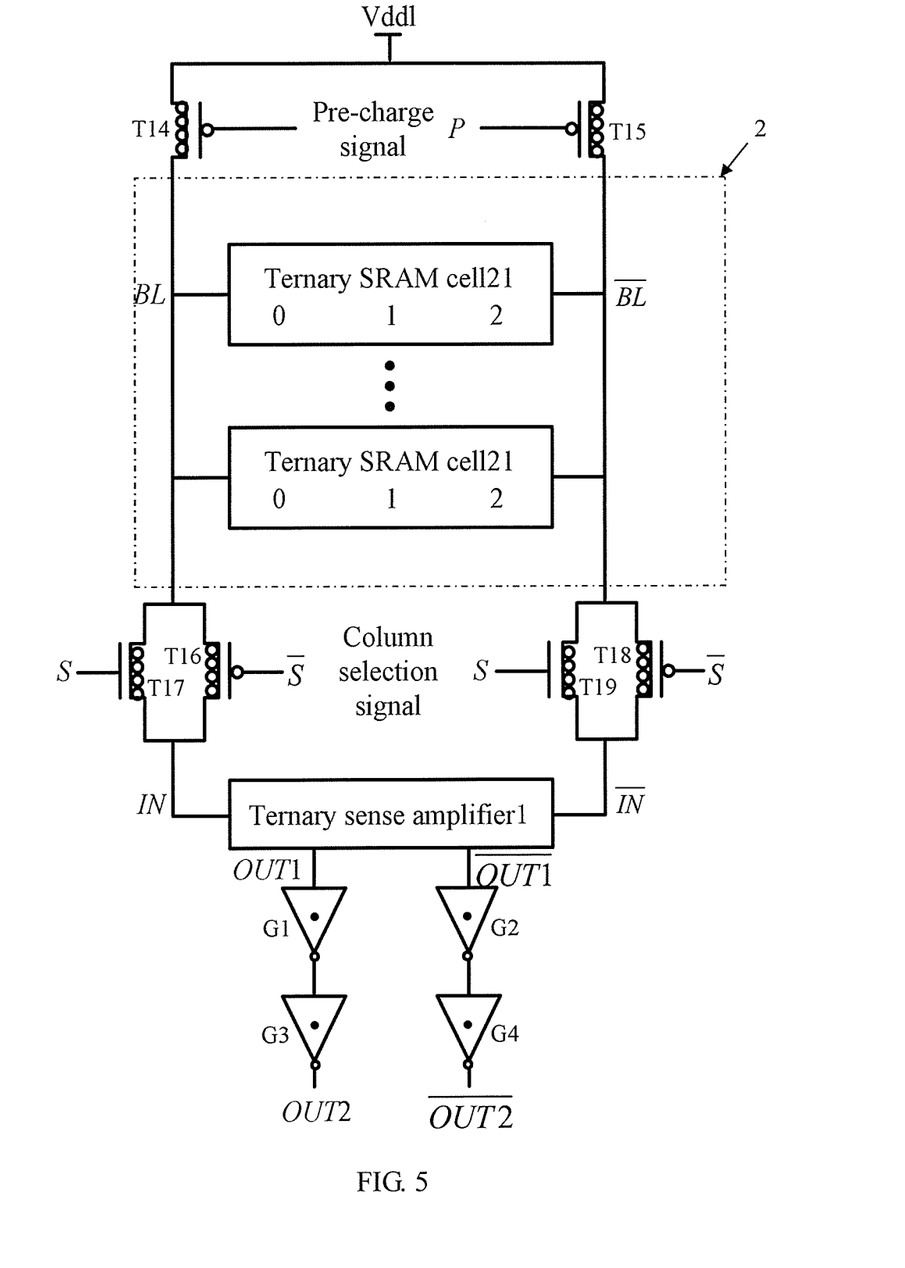
FIG. 5 is the circuit diagram for the SRAM array as realized by the ternary sense amplifier according to the present invention.

As shown in FIG. 1 and FIG. 5, an SRAM array realized by the ternary sense amplifier, comprising a ternary sense amplifier 1, a ternary memory array 2, the IS inverter G1, the $2^{nd}$ inverter G2, the $3^{rd}$ inverter G3, the $4^{th}$ inverter G4, the $14^{th}$ CNFET transistor T14, the $15^{th}$ CNFET transistor T15, the $16^{th}$ CNFET transistor T16, the $17^{th}$ CNFET transistor T17, the $18^{th}$ CNFET transistor T18 and the $19^{th}$ CNFET transistor T19; the said ternary memory array 2 is provided a bit line and an inverting bit line; the $14^{th}$ CNFET transistor T14, the $15^{th}$ CNFET transistor T15, the $16^{th}$ CNFET transistor T16 and the $18^{th}$ CNFET transistor T18 belong to P CNFET transistors; the $17^{th}$ CNFET transistor T17 and the $19^{th}$ CNFET transistor T19 belong to N CNFET transistors; the said ternary sense amplifier 1 comprises the $1^{st}$ CNFET transistor T1, the $2^{nd}$ CNFET transistor T2, the $3^{rd}$ CNFET transistor T3, the $4^{th}$ CNFET transistor T4, the $5^{th}$ CNFET transistor T5, the $6^{th}$ CNFET transistor T6, the $7^{th}$ CNFET transistor T7, the $8^{th}$ CNFET transistor T8, the $9^{th}$ CNFET transistor T9, the $10^{th}$ CNFET transistor T10, the $11^{th}$ CNFET transistor T11, the $12^{th}$ CNFET transistor T12 and the $13^{th}$ CNFET transistor T13; the $1^{st}$ CNFET transistor T1, the $2^{nd}$ CNFET transistor T2, the $3^{rd}$ CNFET transistor T3, the $6^{th}$ CNFET transistor T6, the $11^{th}$ CNFET transistor T11, the $12^{th}$ CNFET transistor T12 and the $13^{th}$ CNFET transistor T13 belong to P CNFET transistors; the $4^{th}$ CNFET transistor T4, the $5^{th}$ CNFET transistor T5, the $7^{th}$ CNFET transistor T7, the $8^{th}$ CNFET transistor T8, the $9^{th}$ CNFET transistor T9 and the $10^{th}$ CNFET transistor T10 belong to N CNFET transistors; source of the $1^{st}$ CNFET transistor T1, source of the $2^{nd}$ CNFET transistor T2, source of the $3^{rd}$ CNFET transistor T3, gate of the $5^{th}$ CNFET transistor T5 and source of the $6^{th}$ CNFET transistor T6 are connected to gate of the $8^{th}$ CNFET transistor T8, and the connecting terminal is connected to the $1^{st}$ power source Vdd; gate of the $1^{st}$ CNFET transistor T1 and gate of the $2^{nd}$ CNFET transistor T2 are connected to gate of the $13^{th}$ CNFET transistor T13, and the connecting terminal is enabling signal input terminal of the said ternary sense amplifier 1; drain of the $1^{st}$ CNFET transistor T1, gate of the $3^{rd}$ CNFET transistor T3, gate of the $4^{th}$ CNFET transistor T4, drain of the $6^{th}$ CNFET transistor T6, drain of the $7^{th}$ CNFET transistor T7 and source of the $8^{th}$ CNFET transistor T8 are connected to drain of the $13^{th}$ CNFET transistor T13, and the connecting terminal is output terminal of the said ternary sense amplifier 1; drain of the $2^{nd}$ CNFET transistor T2, drain of the $3^{rd}$ CNFET transistor T3, drain of the $4^{th}$ CNFET transistor T4, source of the $5^{th}$ CNFET transistor T5, gate of the $6^{th}$ CNFET transistor T6 and gate of the $7^{th}$ CNFET transistor T7 are connected to source of the $13^{th}$ CNFET transistor T13, and the connecting terminal is inverting output terminal of the said ternary sense amplifier 1; source of the $4^{th}$ CNFET transistor T4 is connected to drain of the $9^{th}$ CNFET transistor T9; drain of the $5^{th}$ CNFET transistor T5 is connected to drain of the $8^{th}$ CNFET transistor T8, and the connecting terminal is connected to the $2^{nd}$ power source Vdd1; the $2^{nd}$ power source Vdd1 is equivalent to half of the $1^{st}$ power source Vdd; source of the $7^{th}$ CNFET transistor T7 is connected to drain of the $10^{th}$ CNFET transistor T10; source of the $9^{th}$ CNFET transistor T9, source of the $10^{th}$ CNFET transistor T10 and gate of the $11^{th}$ CNFET transistor T11 are connected to gate of the $12^{th}$ CNFET transistor T12, and the connecting terminal is inverting enabling signal input terminal of the said ternary sense amplifier 1; gate of the $9^{th}$ CNFET transistor T9 is connected to drain of the $11^{th}$ CNFET transistor T11; source of the $11^{th}$ CNFET transistor T11 is input terminal of the said ternary sense amplifier 1; gate of the $10^{th}$ CNFET transistor T10 is connected to drain of the $12^{th}$ CNFET transistor T12; source of the $12^{th}$ CNFET transistor T12 is inverting input terminal of the said ternary sense amplifier 1; source of the $14^{th}$ CNFET transistor T14 and source of the $15^{th}$ CNFET transistor T15 are connected to the $2^{nd}$ power source Vdd1; gate of the $14^{th}$ CNFET transistor T14 is connected to gate of the $15^{th}$ CNFET transistor T15, and the connecting terminal is pre-charge signal input terminal of the SRAM array realized by the said ternary sense amplifier 1; drain of the $14^{th}$ CNFET transistor T14, source of the $16^{th}$ CNFET transistor T16 and drain of the $17^{th}$ CNFET transistor T17 are connected to the bit line of the said memory array 2 respectively; drain of the $15^{th}$ CNFET transistor T15, source of the $18^{th}$ CNFET transistor T18 and drain of the $19^{th}$ CNFET transistor T19 are connected to inverting bit line of the said memory array 2 respectively; gate of the $17^{th}$ CNFET transistor T17 is connected to gate of the $19^{th}$ CNFET transistor, and the connecting terminal is column selection signal input terminal of the SRAM array realized by the said ternary sense amplifier; gate of the $16^{th}$ CNFET transistor T16 is connected to gate of the $18^{th}$ CNFET transistor T18, and the connecting terminal is inverting column selection signal input terminal of the SRAM array realized by the said ternary sense amplifier 1; drain of the 16$^{th}$ CNFET transistor T16 and source of the 17$^{th}$ CNFET transistor T17 are connected to input terminal of the said ternary sense amplifier 1; drain of the 18$^{th}$ CNFET transistor T18 and source of the 19$^{th}$ CNFET transistor T19 are connected to inverting input terminal of the said ternary sense amplifier 1; output terminal of the said ternary sense amplifier 1 is connected to input terminal of the 1$^{st}$ inverter G1; output terminal of the 1$^{st}$ inverter G1 is connected to input terminal of the 3$^{rd}$ inverter G3; output terminal of the 3rd inverter G3 is output terminal of the SRAM array realized by the said ternary sense amplifier 1; inverting output terminal of the said ternary sense amplifier 1 is connected to input terminal of the 2$^{nd}$ inverter G2; output terminal of the 2$^{nd}$ inverter G2 is connected to input terminal of the 4$^{th}$ inverter G4; output terminal of the 4$^{th}$ inverter G4 is output terminal of the SRAM array realized by the said ternary sense amplifier 1.

Embodiment 2

As shown in FIG. 1 and FIG. 5, an SRAM array realized by the ternary sense amplifier, comprising a ternary sense amplifier 1, a ternary memory array 2, the 1$^{st}$ inverter G1, the 2$^{nd}$ inverter G2, the 3$^{rd}$ inverter G3, the 4$^{th}$ inverter G4, the 14$^{th}$ CNFET transistor T14, the 15$^{th}$ CNFET transistor T15, the 16$^{th}$ CNFET transistor T16, the 17$^{th}$ CNFET transistor T17, the 18$^{th}$ CNFET transistor T18 and the 19$^{th}$ CNFET transistor T19; the said ternary memory array 2 is provided a bit line and an inverting bit line; the 14 CNFET transistor T14, the 15$^{th}$ CNFET transistor T15, the 16$^{th}$ CNFET transistor T16 and the 18$^{th}$ CNFET transistor T18 belong to P CNFET transistors; the 17$^{th}$ CNFET transistor T17 and the 19$^{th}$ CNFET transistor T19 belong to N CNFET transistors; the said ternary sense amplifier 1 comprises the 1$^{st}$ CNFET transistor T1, the 2$^{nd}$ CNFET transistor T2, the 3$^{rd}$ CNFET transistor T3, the 4$^{th}$ CNFET transistor T4, the 5$^{th}$ CNFET transistor T5, the 6$^{th}$ CNFET transistor T6, the 7$^{th}$ CNFET transistor T7, the 8$^{th}$ CNFET transistor T8, the 9$^{th}$ CNFET transistor T9, the 10$^{th}$ CNFET transistor T10, the 11$^{th}$ CNFET transistor T11, the 12$^{th}$ CNFET transistor T12 and the 13$^{th}$ CNFET transistor T13; the 1$^{st}$ CNFET transistor T1, the 2$^{nd}$ CNFET transistor T2, the 3rd CNFET transistor T3, the 6$^{th}$ CNFET transistor T6, the 11$^{th}$ CNFET transistor T11, the 12$^{th}$ CNFET transistor T12 and the 13$^{th}$ CNFET transistor T13 belong to P CNFET transistors; the 4$^{th}$ CNFET transistor T4, the 5$^{th}$ CNFET transistor T5, the 7$^{th}$ CNFET transistor T7, the 8$^{th}$ CNFET transistor T8, the 9$^{th}$ CNFET transistor T9 and the 10$^{th}$ CNFET transistor T10 belong to N CNFET transistors; source of the 1$^{st}$ CNFET transistor T1, source of the 2$^{nd}$ CNFET transistor T2, source of the 3$^{rd}$ CNFET transistor T3, gate of the 5$^{th}$ CNFET transistor T5 and source of the 6$^{th}$ CNFET transistor T6 are connected to gate of the 8$^{th}$ CNFET transistor T8, and the connecting terminal is connected to the 1$^{st}$ power source Vdd; gate of the 1$^{st}$ CNFET transistor T1 and gate of the 2$^{nd}$ CNFET transistor T2 are connected to gate of the 13$^{th}$ CNFET transistor T13, and the connecting terminal is enabling signal input terminal of the said ternary sense amplifier 1; drain of the 1$^{st}$ CNFET transistor T1, gate of the 3$^{rd}$ CNFET transistor T3, gate of the 4$^{th}$ CNFET transistor T4, drain of the 6$^{th}$ CNFET transistor T6, drain of the 7$^{th}$ CNFET transistor T7 and source of the 8$^{th}$ CNFET transistor T8 are connected to drain of the 13$^{th}$ CNFET transistor T13, and the connecting terminal is output terminal of the said ternary sense amplifier 1; drain of the 2$^{nd}$ CNFET transistor T2, drain of the 3$^{rd}$ CNFET transistor T3, drain of the 4$^{th}$ CNFET transistor T4, source of the 5$^{th}$ CNFET transistor T5, gate of the 6$^{th}$ CNFET transistor T6 and gate of the 7$^{th}$ CNFET transistor T7 are connected to source of the 13$^{th}$ CNFET transistor T13, and the connecting terminal is inverting output terminal of the said ternary sense amplifier 1; source of the 4$^{th}$ CNFET transistor T4 is connected to drain of the 9$^{th}$ CNFET transistor T9; drain of the 5$^{th}$ CNFET transistor T5 is connected to drain of the 8$^{th}$ CNFET transistor T8, and the connecting terminal is connected to the 2$^{nd}$ power source Vdd1; the 2$^{nd}$ power source Vdd1 is equivalent to half of the 1$^{st}$ power source Vdd; source of the 7$^{th}$ CNFET transistor T7 is connected to drain of the 10$^{th}$ CNFET transistor T10; source of the 9$^{th}$ CNFET transistor T9, source of the 10$^{th}$ CNFET transistor T10 and gate of the 11$^{th}$ CNFET transistor T11 are connected to gate of the 12$^{th}$ CNFET transistor T12, and the connecting terminal is inverting enabling signal input terminal of the said ternary sense amplifier 1; gate of the 9$^{th}$ CNFET transistor T9 is connected to drain of the 11$^{th}$ CNFET transistor T11; source of the 11$^{th}$ CNFET transistor T11 is input terminal of the said ternary sense amplifier 1; gate of the 10$^{th}$ CNFET transistor T10 is connected to drain of the 12$^{th}$ CNFET transistor T12; source of the 12$^{th}$ CNFET transistor T12 is inverting input terminal of the said ternary sense amplifier 1; source of the 14$^{th}$ CNFET transistor T14 and source of the 15$^{th}$ CNFET transistor T15 are connected to the 2$^{nd}$ power source Vdd1; gate of the 14$^{th}$ CNFET transistor T14 is connected to gate of the 15$^{th}$ CNFET transistor T15, and the connecting terminal is pre-charge signal input terminal of the SRAM array realized by the said ternary sense amplifier 1; drain of the 14$^{th}$ CNFET transistor T14, source of the 16$^{th}$ CNFET transistor T16 and drain of the 17$^{th}$ CNFET transistor T17 are connected to the bit line of the said memory array 2 respectively; drain of the 15$^{th}$ CNFET transistor T15, source of the 18$^{th}$ CNFET transistor T18 and drain of the 19$^{th}$ CNFET transistor T19 are connected to inverting bit line of the said memory array respectively; gate of the 17$^{th}$ CNFET transistor T17 is connected to gate of the 19$^{th}$ CNFET transistor, and the connecting terminal is column selection signal input terminal of the SRAM array realized by the said ternary sense amplifier; gate of the 16$^{th}$ CNFET transistor T16 is connected to gate of the 18$^{th}$ CNFET transistor T18, and the connecting terminal is inverting column selection signal input terminal of the SRAM array realized by the said ternary sense amplifier 1; drain of the 16$^{th}$ CNFET transistor T16 and source of the 17$^{th}$ CNFET transistor T17 are connected to input terminal of the said ternary sense amplifier 1; drain of the 18$^{th}$ CNFET transistor T18 and source of the 19$^{th}$ CNFET transistor T19 are connected to inverting input terminal of the said ternary sense amplifier 1; output terminal of the said ternary sense amplifier 1 is connected to input terminal of the 1$^{st}$ inverter G1; output terminal of the 1$^{st}$ inverter G1 is connected to input terminal of the 3$^{rd}$ inverter G3; output terminal of the 3$^{rd}$ inverter G3 is output terminal of the SRAM array realized by the said ternary sense amplifier 1; inverting output terminal of the said ternary sense amplifier 1 is connected to input terminal of the 2$^{nd}$ inverter G2; output terminal of the 2$^{nd}$ inverter G2 is connected to input terminal of the 4$^{th}$ inverter G4; output terminal of the 46$^{th}$ inverter G4 is output terminal of the SRAM array realized by the said ternary sense amplifier 1.

Figure 6:
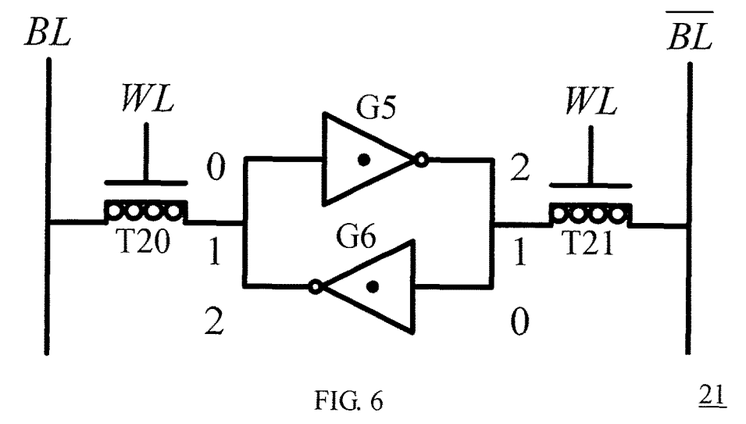
FIG. 6 is the circuit diagram for memory cells in the SRAM array as realized by the ternary sense amplifier according to the present invention.

In this embodiment as shown in FIG. 6, the said ternary memory array 2 comprises numerous ternary memory cells 21; the said ternary memory cell 21 comprises the 20th CNFET transistor T20, the 21$^{st}$ CNFET transistor T21, the 5$^{th}$ inverter G5 and the 6$^{th}$ inverter G6; the 20$^{th}$ CNFET transistor T20 and the 21$^{st}$ CNFET transistor T21 belong to N CNFET transistors; gate of the 20$^{th}$ CNFET transistor T20 is connected to gate of the 21$^{st}$ CNFET transistor T21, and the connecting terminal is bit-line control signal input terminal of the said ternary memory cell 21; drain of the 20$^{th}$ CNFET transistor T20 and input terminal of the 5$^{th}$ inverter G5 are connected to output terminal of the 6$^{th}$ inverter G6; drain of the 21$^{st}$ CNFET transistor T21 and output terminal of the 5$^{th}$ inverter G5 are connected to input terminal of the 6$^{th}$ inverter G6; source of the 2$^{th}$ CNFET transistor T20 is bit-line terminal of the said ternary memory cell 21; source of the 21$^{st}$ CNFET transistor T21 is inverting bit-line terminal of the said ternary memory cell 21; numerous bit-line terminals of the said ternary memory cell 21 are connected, and the connecting line is bit line of the SRAM array realized by the said ternary sense amplifier; numerous inverting bit-line terminals of the said ternary memory cell 21 are connected, and the connecting line is inverting bit line of the SRAM array realized by the said ternary sense amplifier.

Figure 7:
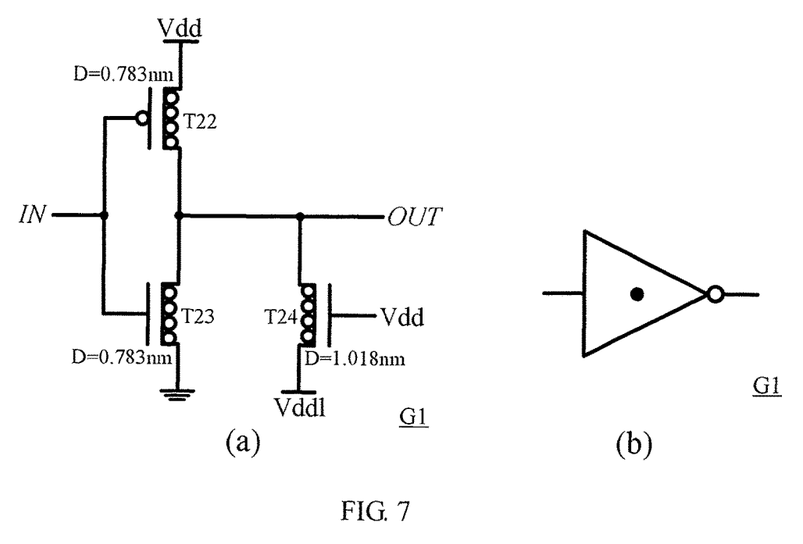
FIG. 7 is the circuit diagram and graphical diagram for the 1st inverter in the SRAM array as realized by the ternary sense amplifier according to the present invention.

In this embodiment as shown in FIG. 7, the 1$^{st}$ inverter G1 comprises the 22$^{nd}$ CNFET transistor T22, the 23$^{rd}$ CNFET transistor T23 and the 24$^{th}$ CNFET transistor T24; the 22$^{nd}$ CNFET transistor T22 belongs to P CNFET transistor; the 23$^{rd}$ CNFET transistor T23 and the 24$^{th}$ CNFET transistor T24 belong to N CNFET transistors; source of the 22$^{nd}$ CNFET transistor T22 and gate of the 24$^{th}$ CNFET transistor T24 are connected to the 1$^{st}$ power source Vdd; gate of the 22$^{nd}$ CNFET transistor T22 is connected to gate of the 23$^{rd}$ CNFET transistor T23, and the connecting terminal is input terminal of the 1$^{st}$ inverter G1; drain of the 22$^{nd}$ CNFET transistor T22 and drain of the 23$^{rd}$ CNFET transistor T23 are connected to source of the 24$^{th}$ CNFET transistor T24, and the connecting terminal is output terminal of the 1$^{st}$ inverter G1; source of the 23$^{rd}$ CNFET transistor T23 is grounded; drain of the 24$^{th}$ CNFET transistor T24 is connected to the 2$^{nd}$ power source Vdd1; structure of the 2$^{nd}$ inverter G2, the 3$^{rd}$ inverter G3, the 4$^{th}$ inverter G4, the 5$^{th}$ inverter G5 and the 6$^{th}$ inverter G6 is identical to that of the 1$^{st}$ inverter G1.

What is claimed is:

1. A ternary sense amplifier, comprising a 1$^{st}$ CNFET transistor, a 2$^{nd}$ CNFET transistor, a 3$^{rd}$ CNFET transistor, a 4$^{th}$ CNFET transistor, a 5$^{th}$ CNFET transistor, a 6$^{th}$ CNFET transistor, a 7$^{th}$ CNFET transistor, an 8$^{th}$ CNFET transistor, a 9$^{th}$ CNFET transistor, a 10$^{th}$ CNFET transistor, an 11$^{th}$ CNFET transistor, a 12$^{th}$ CNFET transistor and a 13$^{th}$ CNFET transistor, wherein the 1$^{st}$ CNFET transistor, the 2$^{nd}$ CNFET transistor, the 3$^{rd}$ CNFET transistor, the 6$^{th}$ CNFET transistor, the 11$^{th}$ CNFET transistor, the 12$^{th}$ CNFET transistor and the 13$^{th}$ CNFET transistor belong to P CNFET transistors, wherein the 4$^{th}$ CNFET transistor, the 5$^{th}$ CNFET transistor, the 7$^{th}$ CNFET transistor, the 8$^{th}$ CNFET transistor, the 9$^{th}$ CNFET transistor and the 10$^{th}$ CNFET transistor belong to N CNFET transistors, wherein source of the 1$^{st}$ CNFET transistor, source of the 2$^{nd}$ CNFET transistor, source of the 3$^{rd}$ CNFET transistor, gate of the 5$^{th}$ CNFET transistor and source of the 6$^{th}$ CNFET transistor are connected to gate of the 8$^{th}$ CNFET transistor, and a connecting terminal is connected to a 1$^{st}$ power source, wherein gate of the 1$^{st}$ CNFET transistor and gate of the 2$^{nd}$ CNFET transistor are connected to gate of the 13$^{th}$ CNFET transistor, and a connecting terminal is an enabling signal input terminal of the ternary sense amplifier, wherein drain of the 1$^{st}$ CNFET transistor, gate of the 3$^{rd}$ CNFET transistor, gate of the 4$^{th}$ CNFET transistor, drain of the 6$^{th}$ CNFET transistor, drain of the 7$^{th}$ CNFET transistor and source of the 8$^{th}$ CNFET transistor are connected to drain of the 13$^{th}$ CNFET transistor, and a connecting terminal is an output terminal of the ternary sense amplifier, wherein drain of the 2$^{nd}$ CNFET transistor, drain of the 3$^{rd}$ CNFET transistor, drain of the 4$^{th}$ CNFET transistor, source of the 5$^{th}$ CNFET transistor, gate of the 6$^{th}$ CNFET transistor and gate of the 7$^{th}$ CNFET transistor are connected to source of the 13$^{th}$ CNFET transistor, and a connecting terminal is an inverting output terminal of the ternary sense amplifier, wherein source of the 4$^{th}$ CNFET transistor is connected to drain of the 9$^{th}$ CNFET transistor, drain of the 5$^{th}$ CNFET transistor is connected to drain of the 8$^{th}$ CNFET transistor, and a connecting terminal is connected to a 2$^{nd}$ power source, wherein the 2$^{nd}$ power source is equivalent to half of the 1$^{st}$ power source, wherein source of the 7$^{th}$ CNFET transistor is connected to drain of the 10$^{th}$ CNFET transistor, wherein source of the 9$^{th}$ CNFET transistor, source of the 10$^{th}$ CNFET transistor and gate of the 11$^{th}$ CNFET transistor are connected to gate of the 12$^{th}$ CNFET transistor, and a connecting terminal is an inverting enabling signal input terminal of the ternary sense amplifier, wherein gate of the 9$^{th}$ CNFET transistor is connected to drain of the 11$^{th}$ CNFET transistor, and source of the 11$^{th}$ CNFET transistor is an input terminal of the ternary sense amplifier, wherein gate of the 10$^{th}$ CNFET transistor is connected to drain of the 12$^{th}$ CNFET transistor, and source of the 12$^{th}$ CNFET transistor is an inverting input terminal of the ternary sense amplifier.

2. An SRAM array realized by a ternary sense amplifier, comprising the ternary sense amplifier, a ternary memory array, a 1st inverter, a 2$^{nd}$ inverter, a 3$^{rd}$ inverter, a 4$^{th}$ inverter, a 14$^{th}$ CNFET transistor, a 15$^{th}$ CNFET transistor, a 16$^{th}$ CNFET transistor, a 17$^{th}$ CNFET transistor, an 18$^{th}$ CNFET transistor and a 19$^{th}$ CNFET transistor, wherein the ternary memory array is provided a bit line and an inverting bit line, wherein the 14$^{th}$ CNFET transistor, the 15$^{th}$ CNFET transistor, the 16$^{th}$ CNFET transistor and the 18$^{th}$ CNFET transistor belong to P CNFET transistors, wherein the 17$^{th}$ CNFET transistor and the 19$^{th}$ CNFET transistor belong to N CNFET transistors, wherein the ternary sense amplifier comprises a 1$^{st}$ CNFET transistor, a 2$^{nd}$ CNFET transistor, a 3$^{rd}$ CNFET transistor, a 4$^{th}$ CNFET transistor, a 5$^{th}$ CNFET transistor, a 6$^{th}$ CNFET transistor, a 7$^{th}$ CNFET transistor, an 8$^{th}$ CNFET transistor, a 9$^{th}$ CNFET transistor, a 10$^{th}$ CNFET transistor, an 11$^{th}$ CNFET transistor, a 12$^{th}$ CNFET transistor and a 13$^{th}$ CNFET transistor, wherein the 1$^{st}$ CNFET transistor, the 2$^{nd}$ CNFET transistor, the 3$^{rd}$ CNFET transistor, the 6$^{th}$ CNFET transistor, the 11$^{th}$ CNFET transistor, the 12$^{th}$ CNFET transistor and the 13$^{th}$ CNFET transistor belong to P CNFET transistors, wherein the 4$^{th}$ CNFET transistor, the 5$^{th}$ CNFET transistor, the 7$^{th}$ CNFET transistor, the 8$^{th}$ CNFET transistor, the 9$^{th}$ CNFET transistor and the 10$^{th}$ CNFET transistor belong to N CNFET transistors, wherein source of the 1$^{st}$ CNFET transistor, source of the 2$^{nd}$ CNFET transistor, source of the 3$^{rd}$ CNFET transistor, gate of the 5$^{th}$ CNFET transistor and source of the 6$^{th}$ CNFET transistor are connected to gate of the 8$^{th}$ CNFET transistor, and a connecting terminal is connected to a 1st power source, wherein gate of the 1$^{st}$ CNFET transistor and gate of the 2$^{nd}$ CNFET transistor are connected to gate of the 13$^{th}$ CNFET transistor, and a connecting terminal is an enabling signal input terminal of the ternary sense amplifier, wherein drain of the 1$^{st}$ CNFET transistor, gate of the 3$^{rd}$ CNFET transistor, gate of the 4$^{th}$ CNFET transistor, drain of the 6$^{th}$ CNFET transistor, drain of the 7$^{th}$ CNFET transistor and source of the 8$^{th}$ CNFET transistor are connected to drain of the 13$^{th}$ CNFET transistor, and a connecting terminal is an output terminal of the ternary sense amplifier, wherein drain of the 2$^{nd}$ CNFET transistor, drain of the 3$^{rd}$ CNFET transistor, drain of the 4$^{th}$ CNFET transistor, source of the 5$^{th}$ CNFET transistor, gate of the 6$^{th}$ CNFET transistor and gate of the 7$^{th}$ CNFET transistor are connected to source of the 13$^{th}$ CNFET transistor, and a connecting terminal is an inverting output terminal of the ternary sense amplifier, wherein source of the 4$^{th}$ CNFET transistor is connected to drain of the 9$^{th}$ CNFET transistor, wherein drain of the 5$^{th}$ CNFET transistor is connected to drain of the 8$^{th}$ CNFET transistor, and a connecting terminal is connected to a 2$^{nd}$ power source, wherein the 2$^{nd}$ power source is equivalent to half of the 1$^{st}$ power source, wherein source of the 7$^{th}$ CNFET transistor is connected to drain of the 10$^{th}$ CNFET transistor, wherein source of the 9$^{th}$ CNFET transistor, source of the 10$^{th}$ CNFET transistor and gate of the 11$^{th}$ CNFET transistor are connected to gate of the 12$^{th}$ CNFET transistor, and a connecting terminal is an inverting enabling signal input terminal of the ternary sense amplifier, wherein gate of the 9$^{th}$ CNFET transistor is connected to drain of the 11$^{th}$ CNFET transistor, and source of the 11$^{th}$ CNFET transistor is an input terminal of the ternary sense amplifier, wherein gate of the 10$^{th}$ CNFET transistor is connected to drain of the 12$^{th}$ CNFET transistor, and source of the 12$^{th}$ CNFET transistor is an inverting input terminal of the ternary sense amplifier, wherein source of the 14$^{th}$ CNFET transistor and source of the 15$^{th}$ CNFET transistor are connected to the 2$^{nd}$ power source, wherein gate of the 14$^{th}$ CNFET transistor is connected to gate of the 15$^{th}$ CNFET transistor, and a connecting terminal is a pre-charge signal input terminal of the SRAM array realized by the ternary sense amplifier, wherein drain of the 14$^{th}$ CNFET transistor, source of the 16$^{th}$ CNFET transistor and drain of the 17$^{th}$ CNFET transistor are connected to the bit line of the memory array respectively, wherein drain of the 15$^{th}$ CNFET transistor, source of the 18$^{th}$ CNFET transistor and drain of the 19$^{th}$ CNFET transistor are connected to the inverting bit line of the memory array respectively, wherein gate of the 17$^{th}$ CNFET transistor is connected to gate of the 19$^{th}$ CNFET transistor, and a connecting terminal is a column selection signal input terminal of the SRAM array realized by the ternary sense amplifier, wherein gate of the 16$^{th}$ CNFET transistor is connected to gate of the 18$^{th}$ CNFET transistor, and a connecting terminal is an inverting column selection signal input terminal of the SRAM array realized by the ternary sense amplifier, wherein drain of the 16$^{th}$ CNFET transistor and source of the 17$^{th}$ CNFET transistor are connected to the input terminal of the ternary sense amplifier, wherein drain of the 18$^{th}$ CNFET transistor and source of the 19$^{th}$ CNFET transistor are connected to the inverting input terminal of the ternary sense amplifier, wherein the output terminal of the ternary sense amplifier is connected to an input terminal of the 1$^{st}$ inverter, an output terminal of the 1$^{st}$ inverter is connected to an input terminal of the 3$^{rd}$ inverter, an output terminal of the 3$^{rd}$ inverter is an output terminal of the SRAM array realized by the ternary sense amplifier, wherein the inverting output terminal of the ternary sense amplifier is connected to an input terminal of the 2$^{nd}$ inverter, an output terminal of the 2$^{nd}$ inverter is connected to an input terminal of the 4$^{th}$ inverter, an output terminal of the 4$^{th}$ inverter is the output terminal of the SRAM array realized by the ternary sense amplifier.

3. The SRAM array realized by the ternary sense amplifier according to claim 2, wherein the ternary memory array comprises a plurality of ternary memory cells; each ternary memory cell comprises a 20$^{th}$ CNFET transistor, a 21$^{st}$ CNFET transistor, a 5$^{th}$ inverter and a 6$^{th}$ inverter, wherein the 20$^{th}$ CNFET transistor and the 21$^{st}$ CNFET transistor belong to N CNFET transistors, wherein gate of the 20$^{th}$ CNFET transistor is connected to gate of the 21$^{st}$ CNFET transistor, and a connecting terminal is a bit-line control signal input terminal of the ternary memory cell, wherein drain of the 20$^{th}$ CNFET transistor and an input terminal of the 5$^{th}$ inverter are connected to an output terminal of the 6$^{th}$ inverter, wherein drain of the 21$^{st}$ CNFET transistor and an output terminal of the 5$^{th}$ inverter are connected to an input terminal of the 6$^{th}$ inverter, wherein source of the 20$^{th}$ CNFET transistor is a bit-line terminal of the ternary memory cell, wherein source of the 21$^{st}$ CNFET transistor is an inverting bit-line terminal of the ternary memory cell, wherein a plurality of bit-line terminals of the plurality of ternary memory cells are connected, and a connecting line is a bit line of the SRAM array realized by the ternary sense amplifier, wherein a plurality of inverting bit-line terminals of the plurality of ternary memory cells are connected, and a connecting line is an inverting bit line of the SRAM array realized by the ternary sense amplifier.

4. The SRAM array realized by the ternary sense amplifier according to claim 3, wherein the 1$^{st}$ inverter comprises a 22$^{nd}$ CNFET transistor, a 23$^{rd}$ CNFET transistor and a 24$^{th}$ CNFET transistor, wherein the 22$^{nd}$ CNFET transistor belongs to P CNFET transistor, the 23$^{rd}$ CNFET transistor and the 24$^{th}$ CNFET transistor belong to N CNFET transistors, wherein source of the 22$^{nd}$ CNFET transistor and gate of the 24$^{th}$ CNFET transistor are connected to the 1$^{st}$ power source, wherein gate of the 22$^{nd}$ CNFET transistor is connected to gate of the 23$^{rd}$ CNFET transistor, and a connecting terminal is the input terminal of the 1st inverter, wherein drain of the 22$^{nd}$ CNFET transistor and drain of the 23$^{rd}$ CNFET transistor are connected to source of the 24$^{th}$ CNFET transistor, and a connecting terminal is the output terminal of the 1$^{st}$ inverter, wherein source of the 23$^{rd}$ CNFET transistor is grounded, and drain of the 24$^{th}$ CNFET transistor is connected to the 2$^{nd}$ power source, wherein a structure of the 2$^{nd}$ inverter, the 3$^{rd}$ inverter, the 4$^{th}$ inverter, the 5$^{th}$ inverter and the 6$^{th}$ inverter is identical to that of the 1$^{st}$ inverter.

* * * * *